(12) United States Patent
Kato et al.

(10) Patent No.: US 10,211,122 B2
(45) Date of Patent: Feb. 19, 2019

(54) SEMICONDUCTOR MODULE INCLUDING A CASE AND BASE BOARD

(71) Applicant: Mitsubishi Electric Corporation, Tokyo (JP)

(72) Inventors: Hajime Kato, Tokyo (JP); Mikio Ishihara, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/511,120

(22) PCT Filed: Dec. 26, 2014

(86) PCT No.: PCT/JP2014/084464
§ 371 (c)(1),
(2) Date: Mar. 14, 2017

(87) PCT Pub. No.: WO2016/103436
PCT Pub. Date: Jun. 30, 2016

(65) Prior Publication Data
US 2017/0278770 A1    Sep. 28, 2017

(51) Int. Cl.
*H01L 23/02* (2006.01)
*H01L 23/367* (2006.01)
(Continued)

(52) U.S. Cl.
CPC ........ *H01L 23/3677* (2013.01); *H01L 23/057* (2013.01); *H01L 23/24* (2013.01);
(Continued)

(58) Field of Classification Search
CPC ... H01L 23/367; H01L 23/373; H01L 23/473; H01L 23/057; H01L 23/3677
(Continued)

(56) References Cited

U.S. PATENT DOCUMENTS 5,586,006 A * 12/1996 Seyama ............ H01L 23/49811
174/255
5,856,911 A *  1/1999 Riley ...................... G06F 1/203
174/16.3
(Continued)

FOREIGN PATENT DOCUMENTS

JP    H11-214612 A    8/1999
JP    2003-078086 A   3/2003
(Continued)

OTHER PUBLICATIONS

International Search Report issued in PCT/JP2014/084464; dated Mar. 10, 2015.
(Continued)

*Primary Examiner* — Caleb Henry
(74) *Attorney, Agent, or Firm* — Studebaker & Brackett PC

(57) ABSTRACT

An object of the present invention is to provide a semiconductor module with high heat dissipation at a low cost. A semiconductor module according to the present invention includes: a case having a hollow portion; a base board made of an aluminum alloy having a first portion corresponding to the hollow portion of the case, and a second portion corresponding to a main body portion of the case, the base board being attached to a bottom face of the case via the second portion; a ceramic insulating substrate disposed on the first portion of the base board; a wiring pattern disposed on the ceramic insulating substrate; semiconductor elements disposed on the wiring pattern; metal wiring boards connected to the semiconductor elements; and a sealing resin that seals the hollow portion of the case.

11 Claims, 9 Drawing Sheets

(51) Int. Cl.
*H01L 25/07* (2006.01)
*H01L 25/18* (2006.01)
*H01L 23/057* (2006.01)
*H01L 23/24* (2006.01)
*H01L 23/373* (2006.01)
*H01L 23/473* (2006.01)
*H01L 23/40* (2006.01)

(52) U.S. Cl.
CPC ...... *H01L 23/3737* (2013.01); *H01L 23/4006* (2013.01); *H01L 23/473* (2013.01); *H01L 23/4735* (2013.01); *H01L 25/07* (2013.01); *H01L 25/18* (2013.01); *H01L 23/3735* (2013.01); *H01L 2224/32225* (2013.01); *H01L 2224/37147* (2013.01); *H01L 2224/37599* (2013.01); *H01L 2224/40137* (2013.01); *H01L 2924/0002* (2013.01); *H01L 2924/181* (2013.01)

(58) Field of Classification Search
USPC .......................................................... 257/687
See application file for complete search history.

(56) References Cited

U.S. PATENT DOCUMENTS

| | | | |
|---|---|---|---|
| 8,102,652 | B2 | 1/2012 | Toh et al. |
| 8,106,497 | B2* | 1/2012 | Brunnbauer ........ H01L 23/3675 257/686 |
| 8,519,532 | B2 | 8/2013 | Lenniger et al. |
| 8,824,144 | B2 | 9/2014 | Toh et al. |
| 8,963,321 | B2 | 2/2015 | Lenniger et al. |
| 9,013,877 | B2 | 4/2015 | Harubeppu et al. |
| 9,171,771 | B2* | 10/2015 | Nishi ...................... H01L 23/36 |
| 9,277,682 | B2 | 3/2016 | Kaneko et al. |
| 9,299,634 | B2* | 3/2016 | Khan ................. H01L 23/3128 |
| 9,741,638 | B2* | 8/2017 | Hsieh .................. H01L 23/427 |
| 2003/0035269 | A1* | 2/2003 | Chiu .................... H01L 23/367 361/704 |
| 2004/0027807 | A1* | 2/2004 | Kashiwagi .......... H01L 23/4093 361/704 |
| 2005/0258550 | A1* | 11/2005 | Morita ................ H01L 21/4871 257/784 |
| 2009/0167134 | A1* | 7/2009 | Tsao ........................... F21K 9/00 313/46 |
| 2012/0020028 | A1* | 1/2012 | Bachman ............ H01L 23/3677 361/719 |
| 2012/0049347 | A1* | 3/2012 | Wang ................... H01L 21/563 257/737 |
| 2017/0053852 | A1 | 2/2017 | Oi et al. |

FOREIGN PATENT DOCUMENTS

| | | |
|---|---|---|
| JP | 2005-322784 A | 11/2005 |
| JP | 2006-004961 A | 1/2006 |
| JP | 2006-179732 A | 7/2006 |
| JP | 2012-015224 A | 1/2012 |
| JP | 2012-191004 A | 10/2012 |
| JP | 2013-038183 A | 2/2013 |
| JP | 2013-062506 A | 4/2013 |
| JP | 2013-093369 A | 5/2013 |
| JP | 2013-115297 A | 6/2013 |
| JP | 2013-161993 A | 8/2013 |
| JP | 2014-053441 A | 3/2014 |
| JP | 2014-165240 A | 9/2014 |
| JP | 2015-216370 A | 12/2015 |
| WO | 2007/105580 A1 | 9/2007 |

OTHER PUBLICATIONS

Yasuaki Isobe et al.; "Corrosion Engineering for Automotive Aluminum Heat Exchangers"; Denso Technical Review; 1999; pp. 64-71; vol. 4, No. 2; Japan.

An Office Action; "Notice of Reasons for Rejection," mailed by the Japanese Patent Office dated Oct. 3, 2017, which corresponds to Japanese Patent Application No. 2016-565791 and is related to U.S. Appl. No. 15/511,120; with English language translation.

Notification Concerning Transmittal of International Preliminary Report on Patentability and Translation of Written Opinion of the International Searching Authority; PCT/JP2014/084464; dated Jul. 6, 2017.

* cited by examiner

F I G. 1
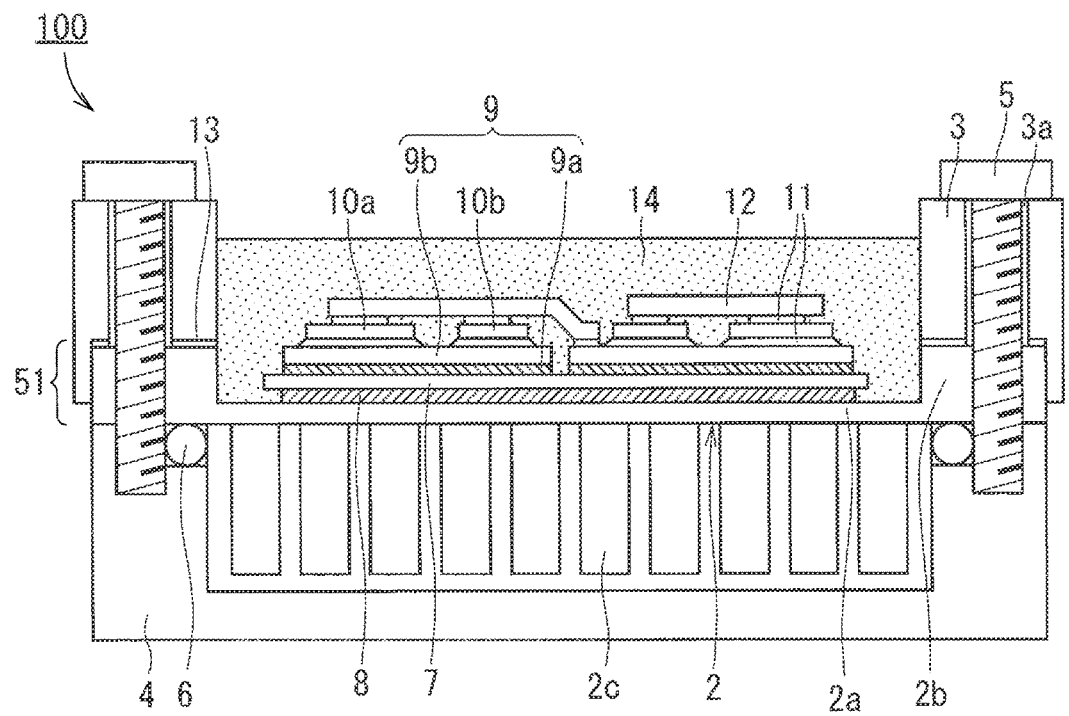

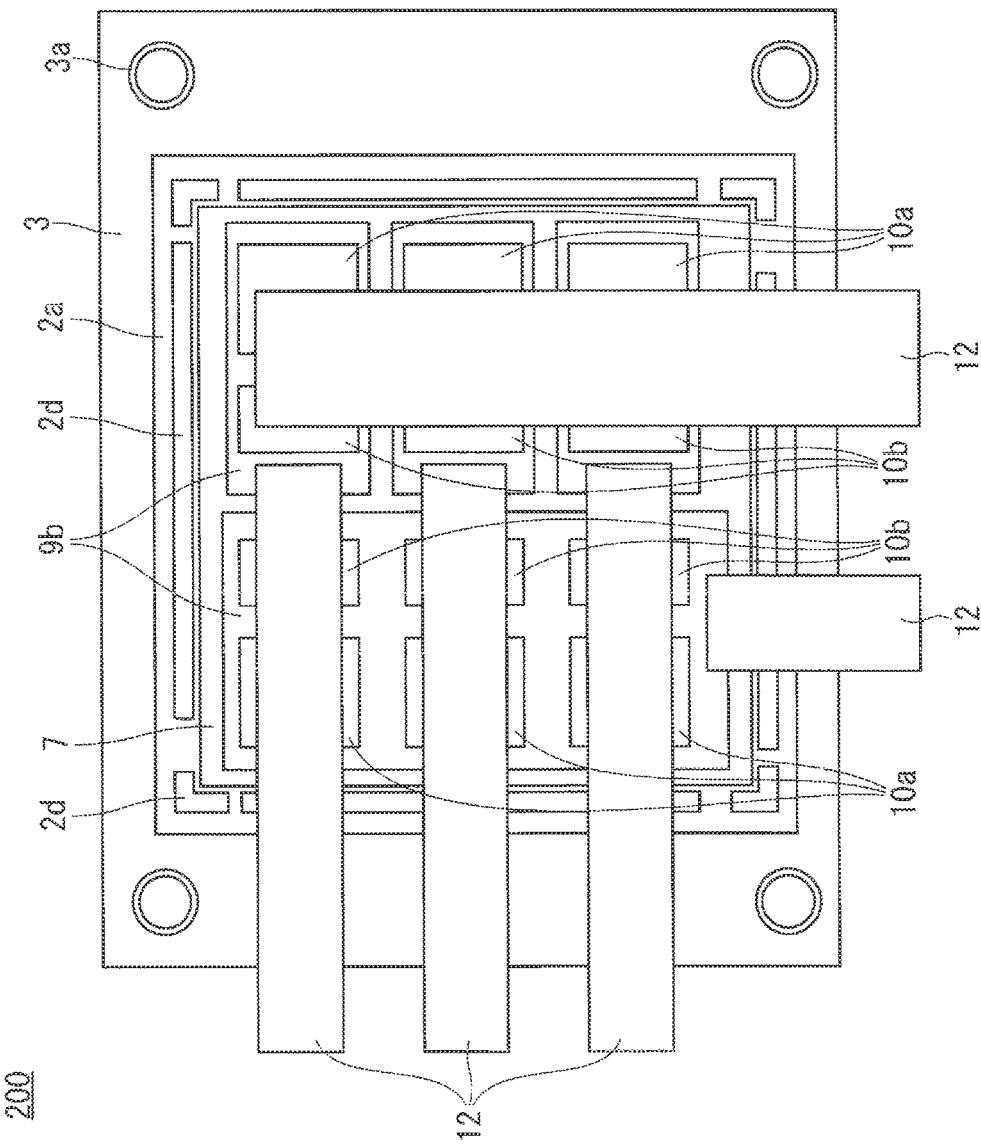
F I G. 6
200

SEMICONDUCTOR MODULE INCLUDING A CASE AND BASE BOARD

TECHNICAL FIELD

The present invention relates to a semiconductor module, such as a semiconductor module for on-vehicle application to be used with a water-cooling jacket attached thereto.

BACKGROUND ART

Conventional semiconductor modules have a problem of a warp in a base board on which a semiconductor element and the like are disposed, during operation. For example, a power module described in Patent Document 1 reduces a warp in a base board by sandwiching a metal layer between two insulating substrates to form a substantially symmetrical structure.

PRIOR ART DOCUMENTS

Patent Document

Patent Document 1: Japanese Patent Application Laid-Open No. 2014-165240

Non-Patent Document

Non-Patent Document 1: Yasuaki Isobe; Keizou Takeuchi; "Corrosion Engineering for Automotive Aluminum Heat Exchangers"; Denso Technical Review, 1999; Vol. 4, No. 2; pp. 64-71

SUMMARY OF INVENTION

Problems to be Solved by the Invention

Unfortunately, the power module described in Patent Document 1 needs two ceramic insulating substrates to prevent thermal deformation of the base board, and thus there is a problem of increasing manufacturing cost.

The present invention has been made to solve the problem as described above, and an object thereof is to provide a semiconductor module with high heat dissipation at a low cost.

Means for Solving the Problems

A semiconductor module according to the present invention includes: a case having a hollow portion; a base board made of an aluminum alloy having a first portion corresponding to the hollow portion of the case, and a second portion corresponding to a main body portion of the case, the base board being attached to a bottom face of the case via the second portion; a ceramic insulating substrate disposed on the first portion of the base board; a wiring pattern disposed on the ceramic insulating substrate; a semiconductor element disposed on the wiring pattern; a metal wiring board connected to the semiconductor element; and a sealing resin that seals the hollow portion of the case where the ceramic insulating substrate, the wiring pattern, the semiconductor element, and the metal wiring board are disposed.

Effects of the Invention

In the semiconductor module according to the present invention, the base board is made of an aluminum alloy. This enables corrosion resistance and rigidity of the base board to be improved. Improving the rigidity of the base board enables the base board to be designed thinner, and thus thermal resistance thereof is reduced to improve heat dissipation thereof. In addition, when pin fins are integrally formed in a heat dissipation face side of the base board by using an aluminum alloy with excellent forgeability, a substantially cylindrical pin with a small draft, and a prismatic pin with a surface area larger than that of a cylinder, can be formed. Accordingly, heat transfer performance of the base board is improved to improve heat dissipation thereof.

Detailed description below and accompanying drawings will define an object, a feature, an aspect, and an advantage of the present invention.

BRIEF DESCRIPTION OF DRAWINGS

FIG. 1 is a sectional view of a semiconductor module and a water-cooling jacket according to an embodiment 1.

FIG. 6 is a plan view of the semiconductor module according to the embodiment 2.

DESCRIPTION OF EMBODIMENTS

<Prerequisite Art>

Figure 12:
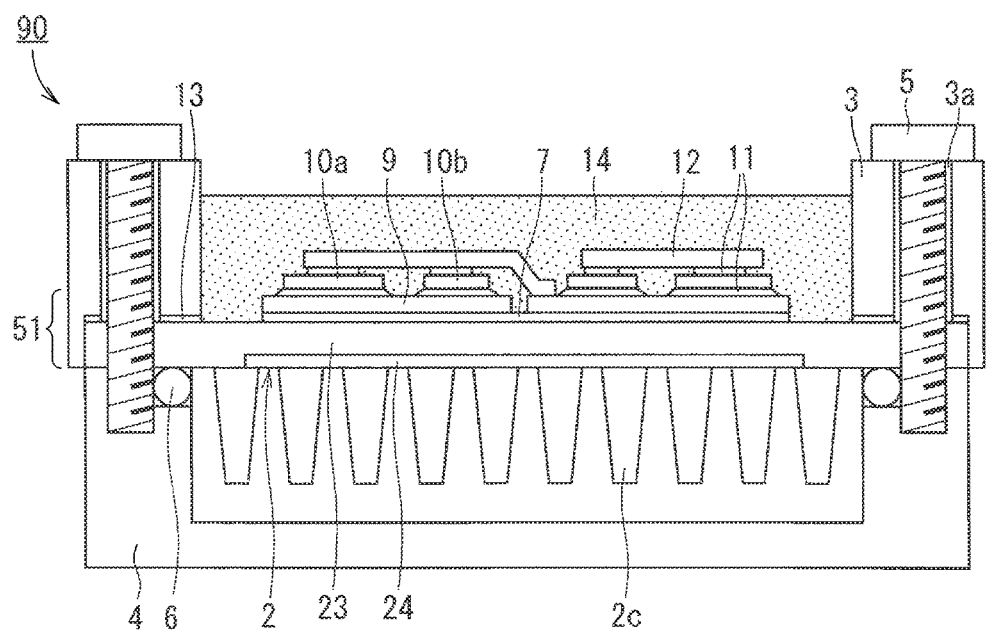
FIG. 12 is a sectional view of a semiconductor module according to a prerequisite art.

Prior to description of embodiments of the present invention, a prerequisite art of the present invention will be described. FIG. 12 is a sectional view of a semiconductor module 90 in the prerequisite art. A base board 51 integrated with a substrate of the semiconductor module 90 in the prerequisite art is formed by joining a ceramic insulating substrate 7 and a base board 2 using a molten metal joint. The base board 2 is formed by embedding a ceramic insulating substrate 24 for a base board in a pure aluminum material 23, as an aggregate. A wiring pattern 9 is provided on the base board 51 integrated with a substrate, and semiconductor elements 10a and 10b, a metal wiring board 12, and the like, are joined on the wiring pattern 9 with a solder material 11. The inside of a case 3 is sealed with a sealing resin 14. In addition, a plurality of pin fins 2c is provided on a heat dissipation face of the base board 2.

In the semiconductor module 90 using the base board 51 integrated with a substrate in the prerequisite art, the ceramic insulating substrate 24 for a base board is embedded in the base board 2 on a heat dissipation face side, as an aggregate, so as to be balanced with the ceramic insulating substrate 7, thereby suppressing a warp due to temperature change. In addition, the pure aluminum material 23 is used for the base board 2 to prevent the ceramic insulating substrate 7 from breaking when a warp is suppressed.

The ceramic insulating substrate 7, the ceramic insulating substrate 24 for a base board, and the pure aluminum material 23, are joined using a casting method called a molten metal joint to manufacture the base board 51 integrated with a substrate.

The semiconductor module 90 is attached to a water-cooling jacket 4 with bolts 5. An O-ring 6 is disposed between the base board 2 and the water-cooling jacket 4 to prevent a coolant from leaking.

In the prerequisite art, an upper limit of screw fastening torque for the water-cooling jacket 4 is restricted. In addition, the pin fin 2c is restricted in size and shape (such as a large draft is required when casting). Further, there is required the ceramic insulating substrate 24 for a base board, with the substantially same size and the same kind as those of the ceramic insulating substrate 7, to prevent thermal deformation of the base board 2, and thus there is a problem of increasing cost. Embodiments below solve the problems described above.

<Embodiment 1>

Figure 2:
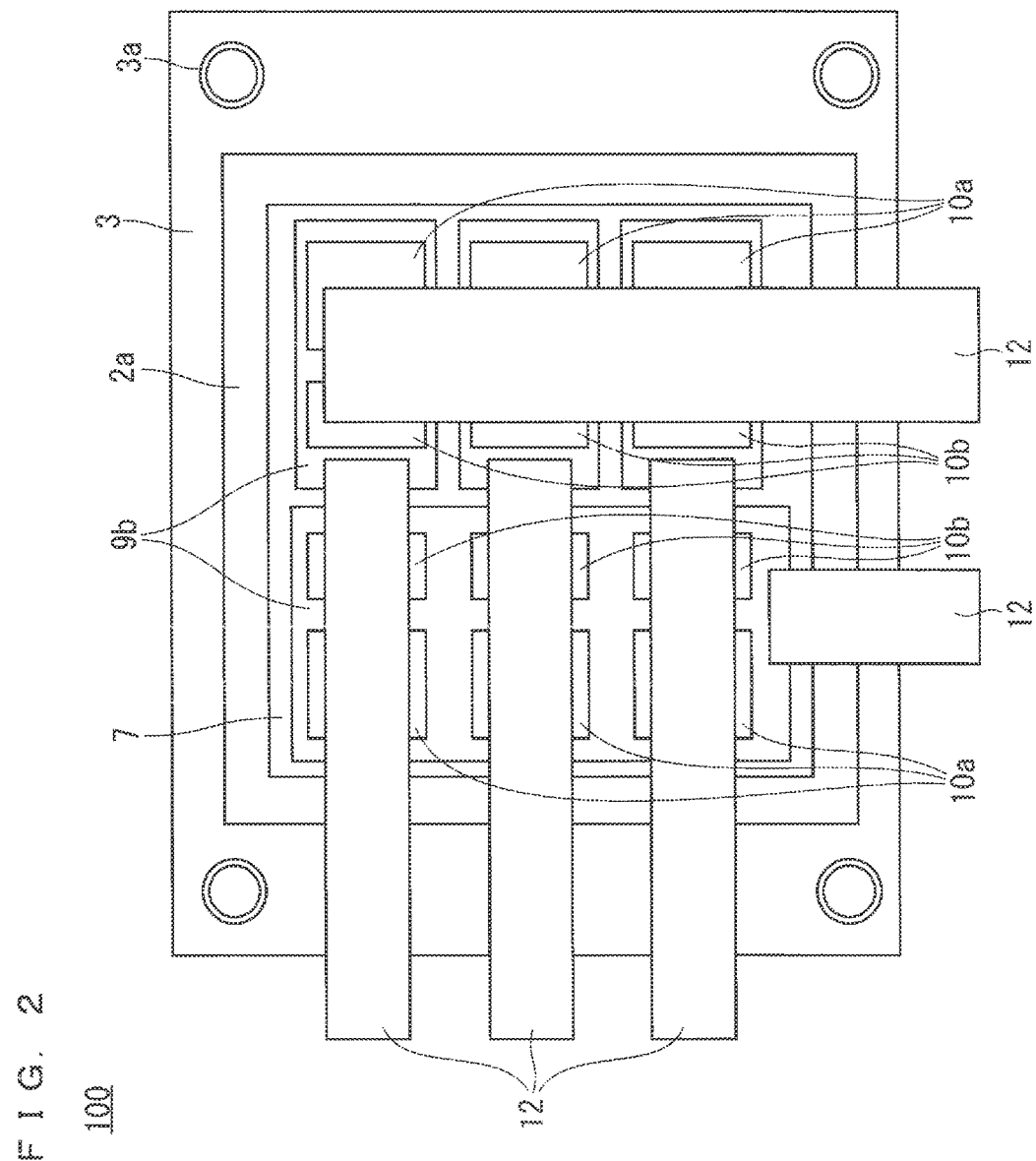
FIG. 2 is a plan view of the semiconductor module according to the embodiment 1.
Figure 3:
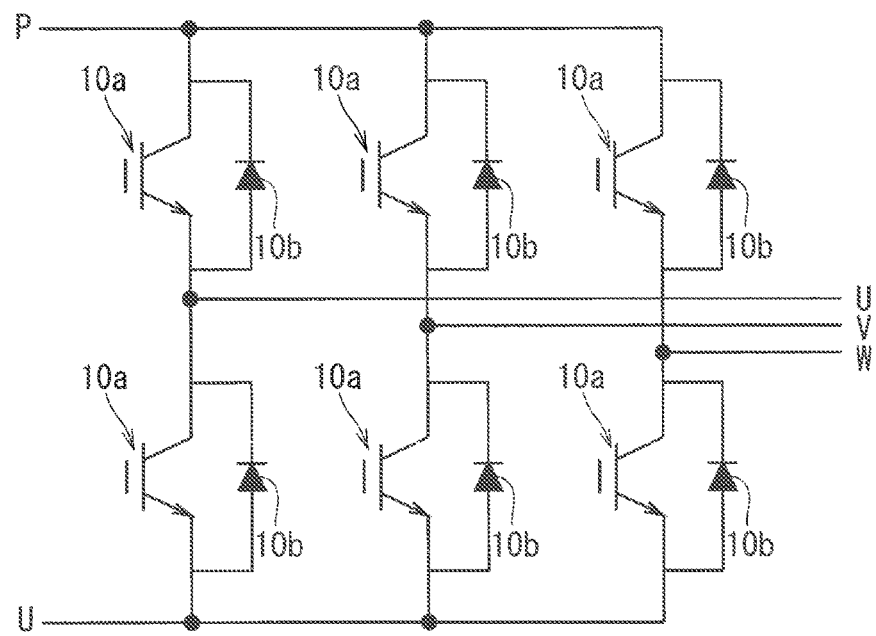
FIG. 3 is a connection diagram of the semiconductor module according to the embodiment 1.

FIG. 1 is a sectional view of a semiconductor module 100 and a water-cooling jacket 4 in the present embodiment 1. FIG. 2 is a plan view of the semiconductor module 100. In addition, FIG. 3 is a connection diagram illustrating wiring between semiconductor elements 10a and 10b of the semiconductor module 100. In FIG. 2, a sealing resin 14 is not illustrated.

The semiconductor module 100 includes a case having a hollow portion 3, a base board 2 made of an aluminum alloy, a ceramic insulating substrate 7, a wiring pattern 9, the semiconductor elements 10a and 10b, and metal wiring boards 12. The semiconductor module 100 further includes the sealing resin 14 that seals the hollow portion of the case 3.

The base board 2 includes a first portion 2a, a second portion 2b, and a plurality of pin fins 2c. The first portion 2a corresponds to the hollow portion of the case 3. The second portion 2b corresponds to a main body portion of the case 3. The base board 2 is attached to a bottom face of the case 3 via the second portion 2b. The pin fins 2c are a plurality of cylindrical pin fins provided on a face on a water-cooling jacket 4 side of the first portion 2a.

A thickness of the second portion 2b is larger than that of the first portion 2a. For example, the thicknesses of the first and second portions are 0.6 mm, and 4 mm, respectively.

The ceramic insulating substrate 7 is provided on the first portion 2a of the base board 2 with a first pure aluminum layer 8 interposed therebetween. The ceramic insulating substrate 7 is made of $Si_3N_4$ or AN, for example. The wiring pattern 9 is provided on a surface of the ceramic insulating substrate 7.

The wiring pattern 9 is configured of second pure aluminum layers 9a of lower layers, and aluminum alloy layers 9b of upper layers. Ni-plating is applied to a surface of each of the aluminum alloy layers 9b. The semiconductor elements 10a and 10b are joined on the aluminum alloy layers 9b with a solder material 11. Upper face electrodes of the respective semiconductor elements 10a and 10b, and the electrodes and the aluminum alloy layers 9b of the wiring pattern, are joined by the corresponding metal wiring boards 12 using the solder material 11. Material of the metal wiring board 12 is copper, for example.

The semiconductor element 10a is an insulated gate bipolar transistor (IGBT), for example. The semiconductor element 10b is a freewheel diode (FWD), for example. The semiconductor elements 10a and 10b each may be a wide bandgap semiconductor element with a material of SiC or GaN, for example.

Holes are provided in an outer peripheral portion of the case 3 to fix the semiconductor module 100. A collar 3a made of metal (e.g. Fe) is inserted into each of the holes. The semiconductor module 100 is fastened to the water-cooling jacket 4 with bolts 5. An O-ring 6 inserted into a groove of the water-cooling jacket 4 is squeezed by force pressing the second portion 2b of the base board 2, generated by each of the bolts 5 via a seat face of the collar 3a, and a gap between the semiconductor module 100 and water-cooling jacket 4 is sealed.

As a material of the base board 2, an aluminum alloy (e.g. A3003 material or A6063 material) with high resistance to plastic deformation amount and high corrosion resistance is used. The thickness of the second portion 2b of the base board 2 is preferably thicker within a range where the second portion 2b can be simultaneously formed with the first portion 2a (with a thickness of 0.6 mm) by forge processing, and thus is set at about 4 mm.

In the present embodiment 1, aluminum layers on an insulating substrate side refer to the first pure aluminum layer 8 and the first portion 2a of the base board 2. Thicknesses of the aluminum layers on the insulating substrate side refer to a sum of a thickness of the first pure aluminum layer 8, a thickness of the first portion 2a of the base board 2, and a thickness of a brazing material. In addition, a thickness of the wiring pattern 9 refers to a sum of a thickness of the second pure aluminum layer 9a and a thickness of the aluminum alloy layer 9b.

Figure 4:
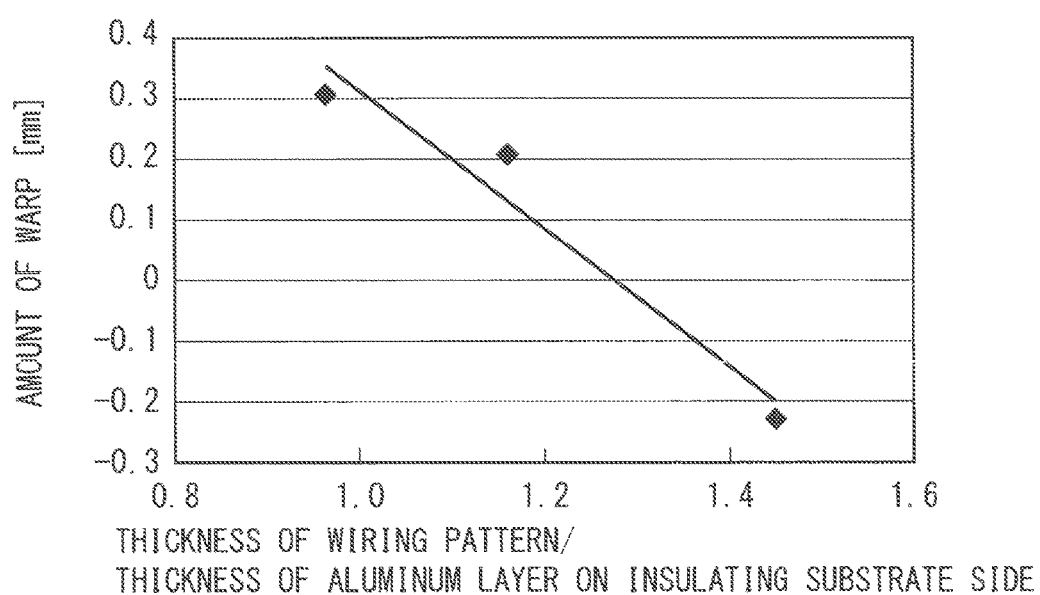
FIG. 4 is a graph showing the amount of warp of a base board when a ratio of thickness of a wiring pattern to thickness of an aluminum layer on an insulating substrate side is changed in the semiconductor module according to the embodiment 1.

FIG. 4 is a graph showing the amount of warp of the base board 2 caused by heating when a ratio of thickness of the wiring pattern 9 to thickness of the aluminum layer on the insulating substrate side is changed. Here, the heating represents heating from 25° C. to 250° C. Results of FIG. 4 are calculated by using simulation analysis.

As can be seen from FIG. 4, when the thickness of the wiring pattern 9 is set not less than 1.1 times and not more than 1.45 times the thickness of the aluminum layer on the insulating substrate side, the amount of warp is reduced within a range of ±0.2 mm. Thermal resistance of the base board is determined by a thickness of aluminum of the ceramic insulating substrate 7 on a heat dissipation face side (thickness of the first pure aluminum layer 8 and the first portion 2a of the base board 2) at this time.

When a ratio of thickness of the wiring pattern 9 to thickness of the aluminum layer on the insulating substrate side is optimized and the amount of warp of the base board 51 integrated with a substrate is reduced to about 0.1 mm, stress to the ceramic insulating substrate 7 increases, and thus substrate breakage may occur. To prevent the substrate breakage, the second and first pure aluminum layers 9a and 8 are respectively inserted into upper and lower layers of the ceramic insulating substrate 7.

Here, the pure aluminum layer represents a layer made of aluminum at a purity of 99.99% or more. The pure aluminum has plastic stress 50% to 70% less than that of an aluminum alloy. The first and second pure aluminum layers 8 and 9a each have a thickness of about 0.6 mm.

As the first portion 2a of the base board 2 is reduced in thickness, thermal resistance can be reduced. As described in the technical data of Denso Corp., related to anticorrosion engineering of a heat exchanger made of an aluminum alloy (refer to Non-Patent Document 1), for example, there is a report in which impurities (e.g. a chlorine ion and a sulfate ion) in a refrigerant cause the A3003 material to have a pitting corrosion of 0.4 mm. Thus, the first portion 2a of the base board 2 needs a minimum thickness of 0.5 mm, and preferably that of 0.6 mm.

An outer peripheral portion of the second portion 2b of the base board 2 of the semiconductor module 100 and the case 3 are fixed with an adhesive 13. Filling the inside of the case 3 with the sealing resin 14 makes a resin seal of the ceramic insulating substrate 7, the wiring pattern 9, the solder material 11, the semiconductor elements 10a and 10b, and the metal wiring board 12.

When semiconductor module 100 is fixed to the water-cooling jacket 4 and is cooled, water pressure (from 0.5 MPa to 1.0 MPa) is applied to a lower surface side of the first portion 2a of the base board 2. In a portion (with a thickness of 0.6 mm) that is not joined to the ceramic insulating substrate 7 of the first portion 2a of the base board 2, a crack or a hole may occur due to repeated deformation and pitting corrosion. Then, a refrigerant may enter the case 3 through the crack or the hole.

When water pressure (from 0.5 MPa to 1.0 MPa) is applied to an area (about 65 mm×65 mm) of the first portion 2a of the base board 2, a stress of about 30 MPa occurs in an end portion (with a thickness of 0.6 mm) where the first portion 2a of the base board 2 and the first pure aluminum layer 8 are not brazed, from simplified calculation. Thus, it is desirable to seal the inside of the case 3 with the sealing resin 14 with a Young's modulus of 100 MPa or more. In addition, to reduce a deformation amount on the wiring pattern 9 on heating (250° C.) to about 0.1 mm or less, the base board 51 integrated with a substrate, to which the semiconductor elements 10a and 10b are soldered, needs a thermal expansion coefficient of about 10 ppm/° C. Accordingly, it is desirable that the sealing resin 14 has a linear expansion coefficient not less than 6 ppm/° C. and not more than 16 ppm/° C., close to this linear expansion coefficient.

<Effect>

The semiconductor module 100 in the present embodiment 1 includes: the case having a hollow portion 3; the base board 2 made of an aluminum alloy having the first portion 2a corresponding to the hollow portion of the case 3, and the second portion 2b corresponding to a main body portion of the case 3, the base board 2 being attached to a bottom face of the case 3 via the second portion 2b; the ceramic insulating substrate 7 disposed on the first portion 2a of the base board 2; the wiring pattern 9 disposed on the ceramic insulating substrate 7; the semiconductor elements 10a and 10b disposed on the wiring pattern 9; the metal wiring boards 12 connected to the semiconductor elements 10a and 10b; and the sealing resin 14 that seals the hollow portion of the case 3 where the ceramic insulating substrate 7, the wiring pattern 9, the semiconductor elements 10a and 10b, and the metal wiring boards 12 are disposed.

In the semiconductor module 100 in the present embodiment 1, the base board 2 is made of an aluminum alloy. This enables corrosion resistance and rigidity of the base board 2 to be improved. Improving the rigidity of the base board 2 enables the base board 2 to be designed thinner, and thus thermal resistance thereof is reduced to improve heat dissipation thereof. In addition, a substantially cylindrical pin with a small draft, and a prismatic pin with a surface area larger than that of a cylinder, can be formed on the base board 2 as the pin fin 2c by using an aluminum alloy with excellent forgeability, and thus heat transfer performance of the base board 2 is improved to improve heat dissipation thereof.

The semiconductor module 100 in the present embodiment 1 further includes the first pure aluminum layer 8 disposed between the first portion 2a of the base board 2 and the ceramic insulating substrate 7, and the wiring pattern 9 includes the aluminum alloy layers 9b, and the second pure aluminum layers 9a disposed between the aluminum alloy layers 9b and the ceramic insulating substrate 7.

Thus, the ceramic insulating substrate 7 can be prevented from breaking by sandwiching the top and bottom of the ceramic insulating substrate 7 with the second and first pure aluminum layers 9a and 8 with a plastic stress lower than an aluminum alloy.

In the semiconductor module 100 in the present embodiment 1, the thickness of the second portion 2b of the base board 2 is larger than that of the first portion 2a.

Thus, screw fastening torque when the semiconductor module 100 is attached to the water-cooling jacket 4 can be increased by making the thickness of the second portion 2b of the base board 2, which does not affect heat dissipation, larger than the thickness of the first portion 2a.

In the semiconductor module 100 in the present embodiment 1, the thickness of the first portion 2a of the base board 2 is 0.5 mm or more.

There is a report in which impurities (e.g. a chlorine ion and a sulfate ion) in a refrigerant cause the A3003 material to have a pitting corrosion of 0.4 mm. Thus, the first portion 2a of the base board 2 needs a minimum thickness of 0.5 mm. Decrease in thickness of the base board 2 has an advantage in heat dissipation.

Further, in the semiconductor module 100 in the present embodiment 1, a ratio of thickness of the wiring pattern 9 to thickness of the base board 2 and the first pure aluminum layer 8 is (not less than 1.1 and not more than 1.45):1.

Thus, the amount of warp of the base board 2 can be brought within about 0.2 mm by setting a ratio of thickness of the wiring pattern 9 to thickness of the base board 2 and the first pure aluminum layer 8 within the range above. In addition, a warp of the entire semiconductor module 100 can be reduced.

Further, in the semiconductor module 100 in the present embodiment 1, an aluminum alloy of the base board 2 is an Al—Mn-based aluminum alloy or an Al—Si—Mg-based aluminum alloy.

Thus, a substantially cylindrical pin with a small draft, and a prismatic pin with a surface area larger than that of a cylinder, can be formed on the base board 2 as the pin fin 2c by using an aluminum alloy with excellent forgeability, such as an Al-Mn-based alloy or an Al—Si—Mg-based alloy, as material of the base board 2, and thus heat transfer performance of the base board 2 is improved to improve heat dissipation thereof.

Further, in the semiconductor module 100 in the present embodiment 1, the sealing resin 14 has a Young's modulus of 100 MPa or more, and a linear expansion coefficient not less than 6 ppm/° C. and not more than 16 ppm/° C.

Thus, deformation of the semiconductor module 100 due to water pressure received from a water-cooling jacket 4 side thereof can be suppressed by setting a Young's modulus of the sealing resin 14 at 100 MPa or more.

Further, in the semiconductor module 100 in the present embodiment 1, the semiconductor elements 10a and 10b each are a wide bandgap semiconductor element.

Accordingly, since the semiconductor module 100 including the aluminum alloy layer 9b as the wiring pattern 9 is capable of operating at a high temperature, mounting a wide bandgap semiconductor element that operates at a high temperature is particularly effective.

<Embodiment 2>

Figure 5:
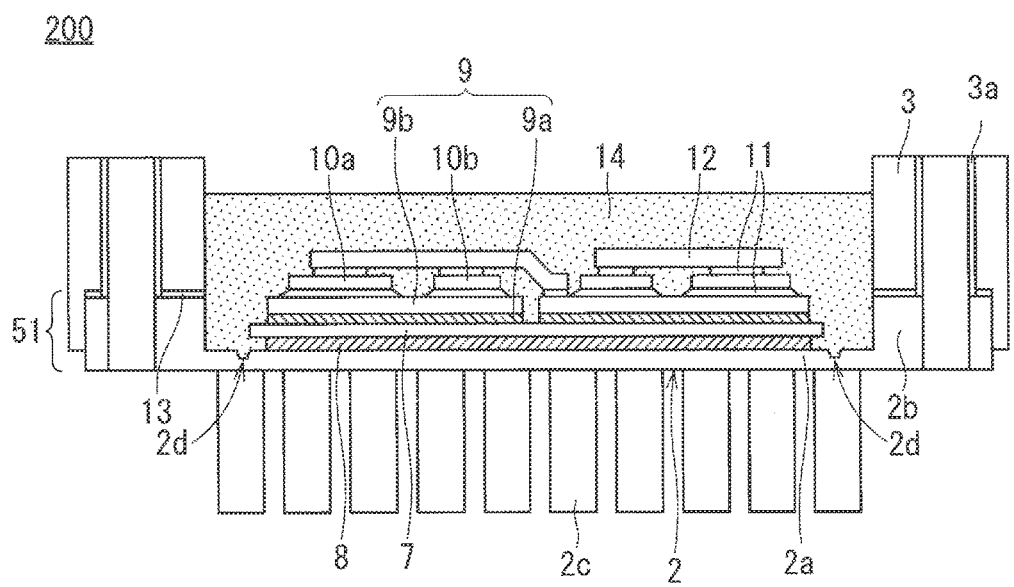
FIG. 5 is a sectional view of a semiconductor module according to an embodiment 2.

FIGS. 5 and 6 are respectively a sectional view and a plan view of a semiconductor module 200 in the present embodiment 2. Note that in FIG. 6, a sealing resin 14 is not illustrated.

In the semiconductor module 200, grooves 2d are provided in a region in a top face of a first portion 2a of a base board 2, the region being not joined to a ceramic insulating substrate 7. When the inside of a case 3 is filled with the sealing resin 14, the grooves 2d are also filled with the sealing resin. The sealing resin 14 entering the grooves 2d increases adhesive strength between the base board 2 and the sealing resin 14.

As illustrated in FIG. 6, a plurality of the grooves 2d is intermittently provided along an outer periphery of the ceramic insulating substrate 7 in a plan view. An arrangement pattern of the grooves 2d is not limited to that of FIG. 6, and providing the groove 2d at least at one place enables the effect described above to be acquired. Since another structure is the same as that of the embodiment 1 (FIGS. 1 and 2), description thereof is omitted.

<Effect>

In the semiconductor module 200 in the present embodiment 2, the base board 2 includes the grooves 2d along the outer periphery of the ceramic insulating substrate 7, in a surface of the first portion 2a on which the ceramic insulating substrate 7 is disposed.

A portion of the first portion 2a of the base board 2, along the outer periphery of the ceramic insulating substrate 7, has a large difference between linear expansion coefficients of a first pure aluminum layer 8 and the sealing resin 14. Thus, the portion may be a starting point of occurrence of peeling of the sealing resin 14. When the peeling develops into a boundary surface between the sealing resin 14 and the ceramic insulating substrate 7, the peeling may cause deterioration in dielectric voltage or a substrate crack. Increasing adhesion between the base board 2 and the sealing resin 14 by providing the grooves 2d in the portion to be a starting point of the peeling improves reliability of a temperature cycle and the like.

<Embodiment 3>

Figure 7:
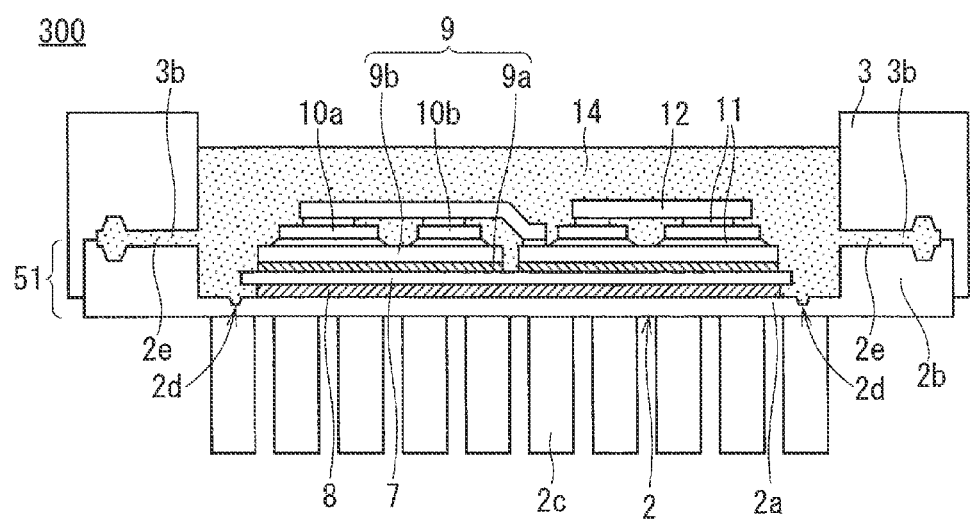
FIG. 7 is a sectional view of a semiconductor module according to an embodiment 3.

FIG. 7 is a sectional view of a semiconductor module 300 in the present embodiment 3. In the semiconductor module 300, a groove 2e is provided in a top face of a second portion 2b of a base board 2. In addition, a groove 3b is provided in a portion of a case 3, facing the groove 2e. The groove 2e and the groove 3b open to a hollow portion of the case 3. That is, the groove 2e and the groove 3b are connected with the hollow portion of the case 3.

The grooves 2e and 3b are filled with a sealing resin 14. The case 3 and the base board 2 are bonded with the sealing resin 14 filled in the grooves 2e and 3b. Since another structure is the same as that of the embodiment 1, description thereof is omitted.

<Effect>

The semiconductor module 300 in the present embodiment 3 further includes the grooves 3b and 2e that are provided in a facing portion in which a main body portion of the case 3 and the second portion 2b of the base board 2 facing each other, facing the main body portion, the grooves 3b and 2e opening to the hollow portion of the case 3.

Thus, when vacuum degassing is performed in a state where the sealing resin 14 is poured into the case 3, the sealing resin 14 enters the groove 2e and the groove 3b, and thus the case 3 and the base board 2 can be bonded to each other. As described above, the present embodiment 3 is provided with the grooves 2e and 3b to allow a sealing resin to enter the grooves to bond the case 3 and the base board 2 to each other, and thus the adhesive 13 and a step of bonding the case 3 and the base board 2 with the adhesive 13 in the embodiment 1 (FIG. 1) are unnecessary.

<Embodiment 4>

Figure 8:
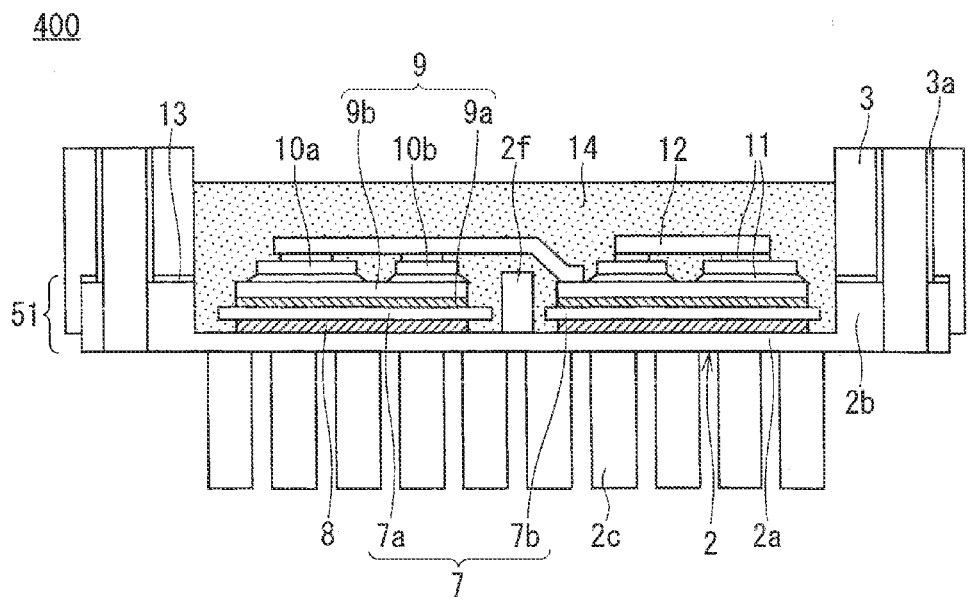
FIG. 8 is a sectional view of a semiconductor module according to an embodiment 4.
Figure 9:
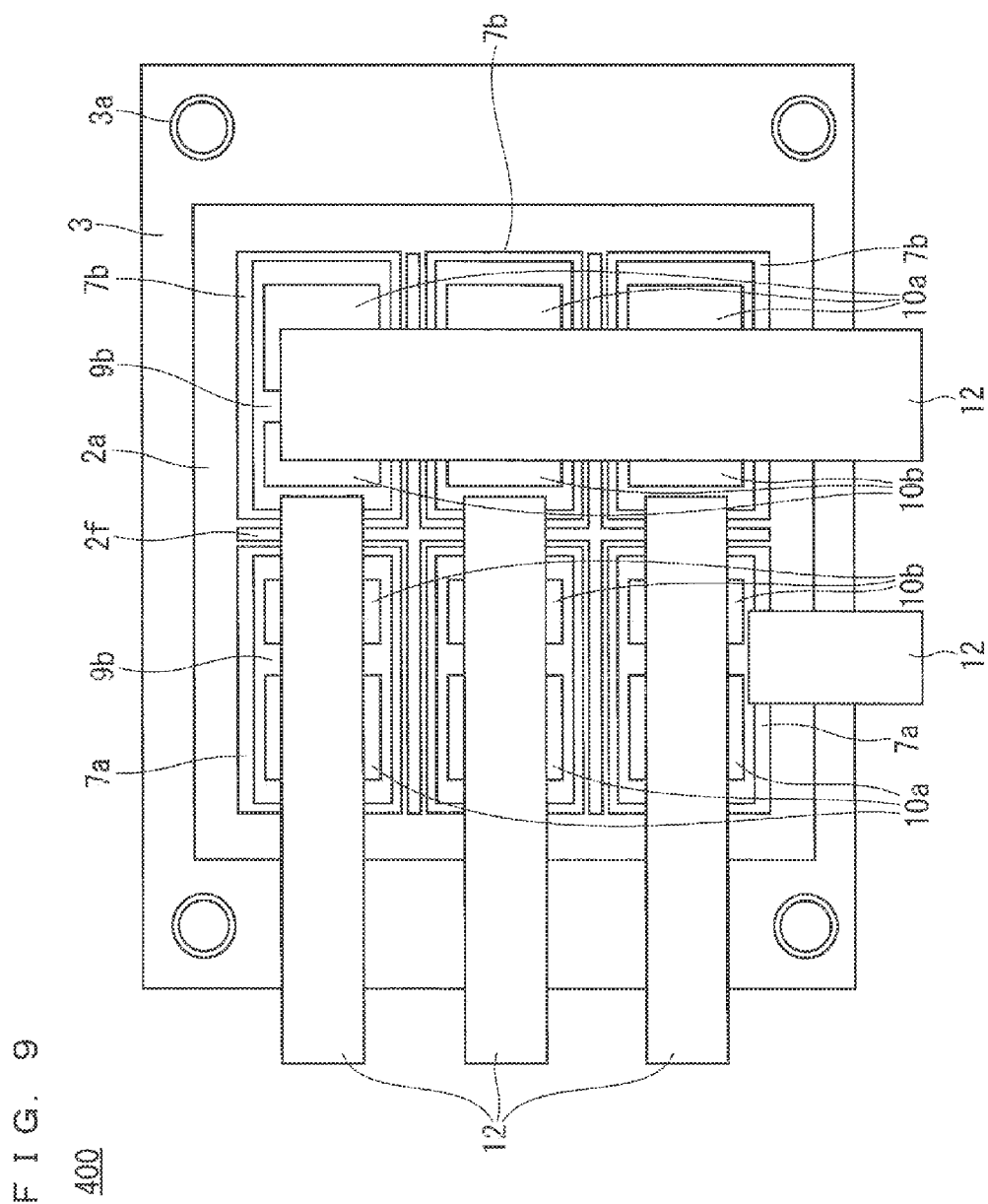
FIG. 9 is a plan view of the semiconductor module according to the embodiment 4.

FIGS. 8 and 9 are respectively a sectional view and a plan view of a semiconductor module 400 in the present embodiment 4. Note that in FIG. 9, a sealing resin 14 is not illustrated.

In the present embodiment 4, a ceramic insulating substrate 7 is configured of a plurality of insulating substrates including first and second ceramic insulating substrates 7a and 7b (it is configured of six insulating substrates in FIG. 9).

In a face of a first portion 2a of a base board 2, on a side where the ceramic insulating substrate 7 is joined, a beam portion 2f is provided between each of a plurality of insulating substrates in a plan view. For example, as illustrated in FIG. 8, the beam portion 2f is provided between the first and second ceramic insulating substrates 7a and 7b. Since another structure is the same as that of the embodiment 1, description thereof is omitted.

<Effect>

In the semiconductor module 400 in the present embodiment 4, the ceramic insulating substrate 7 includes the first and second ceramic insulating substrates 7a and 7b, and further includes the beam portion 2f disposed between the first and second ceramic insulating substrates 7a and 7b on the base board 2.

Thus, rigidity of the base board 2 increases due to the provision of the beam portion 2f on the base board 2. In addition, since the ceramic insulating substrate 7 is divided into a plurality of small ceramic insulating substrates, stress to be received by the individual ceramic insulating substrate is reduced, and thus a range of choice of a Young's modulus and a linear expansion coefficient, required for the sealing resin 14, is widened. Accordingly, a more inexpensive sealing resin 14 is available.

<Embodiment 5>

Figure 10:
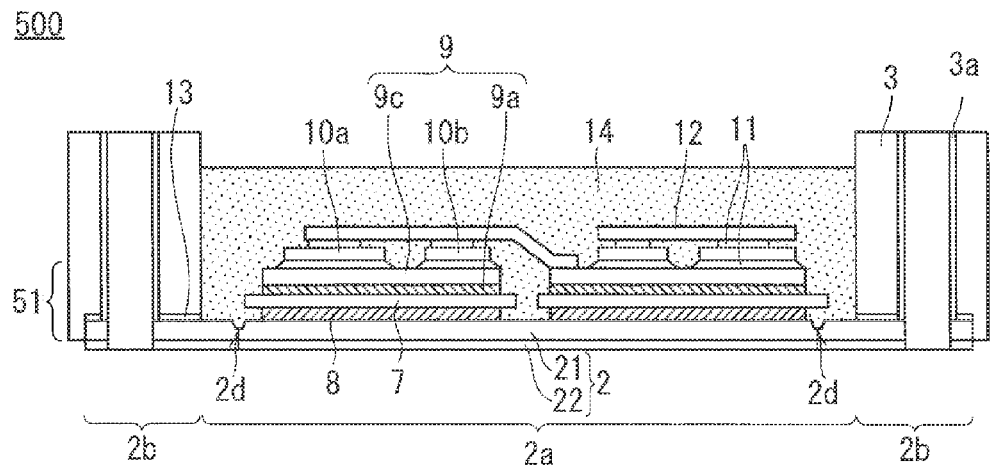
FIG. 10 is a sectional view of a semiconductor module according to an embodiment 5.
Figure 11:
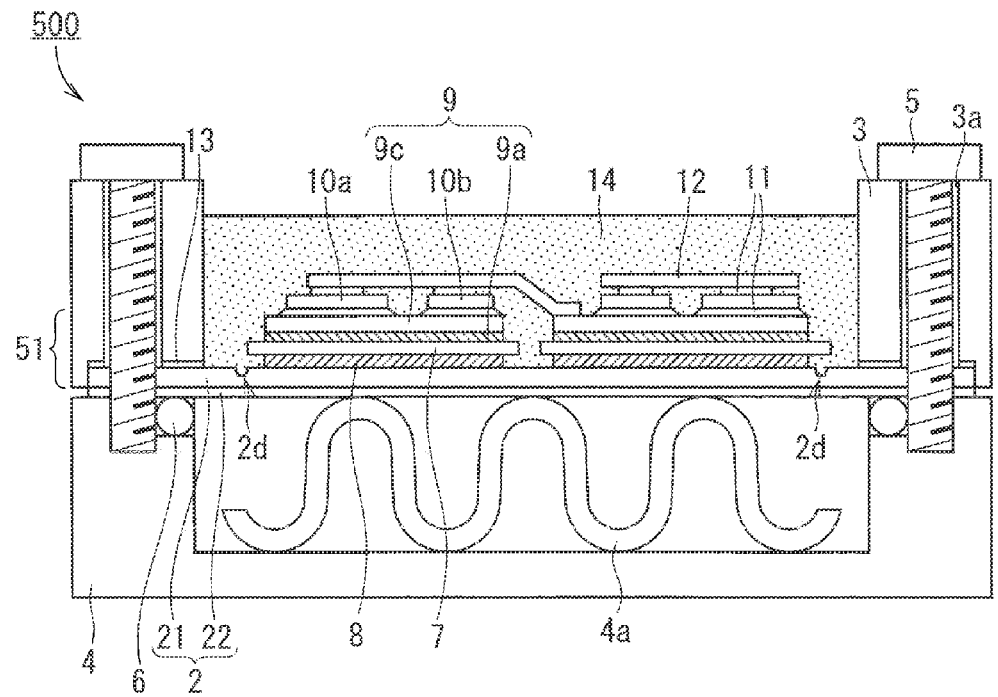
FIG. 11 is a sectional view of the semiconductor module and a water-cooling jacket according to the embodiment 5.

FIG. 10 is a sectional view of a semiconductor module 500 in the present embodiment 5. FIG. 11 is a sectional view of structure in which a water-cooling jacket 4 is attached to the semiconductor module 500.

In the embodiment 1 (semiconductor module 100), material of the base board 2 is an aluminum alloy. In addition, in the present embodiment 1, the wiring pattern 9 is configured of the second pure aluminum layer 9a and the aluminum alloy layer 9b.

In contrast, in the present embodiment 5, a base board 2 is formed of a clad material of a copper alloy layer 21 and an aluminum alloy layer 22. In addition, a wiring pattern 9 is configured of a second pure aluminum layer 9a and a copper alloy layer 9c.

In the base board 2, the aluminum alloy layer 22 is used for a face with which a refrigerant in the water-cooling jacket 4 is brought into contact, for corrosion control of copper. The copper alloy layer 21 of the base board 2 and the copper alloy layer 9c of the wiring pattern 9 are provided to balance stress in the top and bottom of the ceramic insulating substrate 7.

In the present embodiment 5, the base board 2 is formed of a clad material. Since a clad material made of bar materials is cheaper, the base board 2 is not provided with a pin fin 2c, and a fin 4a is provided on a water-cooling jacket 4 side. Since another structure is the same as that of the embodiment 1, description thereof is omitted.

<Effect>

In the semiconductor module 500 in the present embodiment 5, the wiring pattern 9 includes the copper alloy layer 9c instead of the aluminum alloy layer 9b, and the base board 2 is formed of a clad material of the aluminum alloy layer 22 and the copper alloy layer 21, instead of an aluminum alloy.

Thus, according to the present embodiment 5, transient thermal resistance can be reduced by providing the copper alloy layer 9c and the copper alloy layer 21 in lower layers of semiconductor elements 10a and 10b. Copper has a recrystallization temperature higher than that of aluminum, and thus, when a SiC semiconductor element capable of high-temperature operation, or the like, is mounted as the semiconductor elements 10a and 10b, the semiconductor elements 10a and 10b can be used at a high temperature.

While the present invention is described in detail, the description above is an example in all aspects, and the present invention is not limited to the description. Thus, it is perceived that countless variations being not shown by way of example can be assumed without departing from the scope of the present invention.

REFERENCE SIGNS LIST

2: base board
2a: first portion
2b: second portion
2c: pin fin
2d, 2e, 3b: groove
2f: beam portion
3: case
3a: collar
4: water-cooling jacket
5: bolt
6: O-ring
7: ceramic insulating substrate
7a: first ceramic insulating substrate
7b: second ceramic insulating substrate
8: first pure aluminum layer
9: wiring pattern
9a: second pure aluminum layer
9b: aluminum alloy layer
10a, 10b: semiconductor element
11: solder material
12: wiring board
13: adhesive
14: sealing resin
21: copper alloy layer
22: aluminum alloy layer
23: pure aluminum material
24: ceramic insulating substrate for base board
51: base board integrated with substrate
90, 100, 200, 300, 400, 500: semiconductor module

The invention claimed is:

1. A semiconductor module comprising:
a case having a hollow portion;
a base board made of an aluminum alloy having a first portion corresponding to said hollow portion of said case, and a second portion corresponding to a main body portion of said case, said base board being attached to a bottom face of said case via said second portion;
a ceramic insulating substrate disposed on said first portion of said base board;
a first pure aluminum layer disposed between said first portion of said base board and said ceramic insulating substrate;
a wiring pattern disposed on said ceramic insulating substrate;
a semiconductor element disposed on said wiring pattern;
a metal wiring board connected to said semiconductor element; and
a sealing resin that seals said hollow portion of said case where said ceramic insulating substrate, said wiring pattern, said semiconductor element, and said metal wiring board are disposed, wherein
said wiring pattern includes
an aluminum alloy layer, and
a second pure aluminum layer disposed between the aluminum alloy layer and said ceramic insulating substrate.

2. The semiconductor module according to claim 1, wherein
a thickness of said second portion of said base board is larger than a thickness of said first portion.

3. The semiconductor module according to claim 1, wherein the thickness of said first portion of said base board is 0.5 mm or more.

4. The semiconductor module according to claim 1, wherein
a ratio of thickness of said wiring pattern to thickness of said base board and said first pure aluminum layer is (not less than 1.1 and not more than 1.45) : 1.

5. The semiconductor module according to claim 1, wherein
said aluminum alloy of said base board is an Al-Mn-based aluminum alloy or an Al—Si—Mg-based aluminum alloy.

6. The semiconductor module according to claim 1, wherein
said sealing resin has a Young's modulus of 100 MPa or more, and a linear expansion coefficient not less than 6 ppm/° C. and not more than 6 ppm/° C.

7. The semiconductor module according to claim 1, wherein
said base board includes a groove along an outer periphery of said ceramic insulating substrate, in a surface of said first portion on which said ceramic insulating substrate is disposed.

8. The semiconductor module according to claim 1, further comprising:
a groove that is provided in a facing portion in which said main body portion of said case and said second portion of said base board facing each other, said groove opening to said hollow portion of said case.

9. The semiconductor module according to claim 1, wherein
said ceramic insulating substrate includes first and second ceramic insulating substrates, and
the semiconductor module further comprises a beam portion disposed between said first and second ceramic insulating substrates on said base board.

10. The semiconductor module according to claim 1, wherein and said base board is formed of a clad material of an aluminum alloy and a copper alloy, instead of said aluminum alloy.

11. The semiconductor module according to claim 1, wherein said semiconductor element is a wide bandgap semiconductor element.

\* \* \* \* \*